United States Patent
Wampler et al.

(10) Patent No.: US 11,204,391 B2
(45) Date of Patent: Dec. 21, 2021

(54) METHOD AND APPARATUS FOR MONITORING A BATTERY STATE ESTIMATOR

(71) Applicant: GM GLOBAL TECHNOLOGY OPERATIONS LLC, Detroit, MI (US)

(72) Inventors: Charles W. Wampler, Birmingham, MI (US); Justin R. McDade, Livonia, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 223 days.

(21) Appl. No.: 16/570,205

(22) Filed: Sep. 13, 2019

(65) Prior Publication Data
US 2021/0080506 A1 Mar. 18, 2021

(51) Int. Cl.
*G01R 31/387* (2019.01)
*H01M 10/44* (2006.01)
(Continued)

(52) U.S. Cl.
CPC ....... *G01R 31/387* (2019.01); *G01R 31/3842* (2019.01); *G01R 31/392* (2019.01);
(Continued)

(58) Field of Classification Search
None
See application file for complete search history.

(56) References Cited

U.S. PATENT DOCUMENTS

| | | | |
|---|---|---|---|
| 10,295,600 B2* | 5/2019 | Coenen | G01R 31/3842 |
| 2014/0077815 A1* | 3/2014 | Mattisson | G01R 31/367 |
| | | | 324/426 |

(Continued)

OTHER PUBLICATIONS

Wang, Liu, Hicks-Garner, Sherman, Soukiazian, Verbrugge, Tataria, Musser, Finamore; Cycle-ife model for graphiet-LiFePo4 cells; Elsevier, Journal of Power Sources 196 (2011) 3942-3948.

(Continued)

*Primary Examiner* — Arleen M Vazquez
*Assistant Examiner* — Terence E Stifter, Jr.
(74) *Attorney, Agent, or Firm* — Quinn IP Law

(57) ABSTRACT

A method and system for monitoring a charge capacity of a battery includes determining a predicted charge capacity and a first uncertainty parameter based upon the current, voltage, and temperature of the battery, wherein the predicted charge capacity is determined by executing a charge capacity degradation model. A measured charge capacity and an associated second uncertainty parameter of the battery are also determined, by executing a charge capacity update routine. A charge capacity estimate for the battery is determined based upon the predicted charge capacity and the measured charge capacity, and an updated uncertainty parameter for the charge capacity estimate is determined based upon the first and the second uncertainty parameters. An estimated covariance parameter, and a covariance ratio are determined based upon the updated uncertainty parameter and the estimated covariance parameter. A remedial battery management operation is commanded based upon the uncertainty parameter for the charge capacity estimate.

19 Claims, 2 Drawing Sheets

(51) Int. Cl.
  *G01R 31/3842* (2019.01)
  *G01R 31/392* (2019.01)
  *H02J 7/00* (2006.01)
  *G01R 31/367* (2019.01)

(52) U.S. Cl.
  CPC ......... *H01M 10/448* (2013.01); *G01R 31/367* (2019.01); *H02J 7/0048* (2020.01)

(56) References Cited

U.S. PATENT DOCUMENTS

| | | | |
|---|---|---|---|
| 2014/0309911 A1* | 10/2014 | Le | G01R 31/367 701/112 |
| 2017/0225584 A1* | 8/2017 | Jin | G01R 31/392 |
| 2018/0001744 A1* | 1/2018 | Vehr | B60H 1/00428 |
| 2018/0034285 A1* | 2/2018 | Baumgartner | H02J 7/35 |
| 2018/0120361 A1* | 5/2018 | Choi | H01M 10/44 |

OTHER PUBLICATIONS

Deshpande, Verbrugge, Cheng, Wang, Liu; Battery Cycle Life Prediction with Coupled Chemical Degradation and Fatigue Mechanics: ESC, Journal of The Electrochemical Society, 159 (10) A1730-A1738 (2012).

Purewal, Wang, Graetz, Soukiazian, Tataria, Verbrugge; Degradation of lithium ion batteries employing graphite negatives and nickel-cobalt-manganese oxide + spinel manganese oxide positives: Part 2, chemical-mechanical degradation model; Elsevier, Journal of Power Sources 272 (2014) 1154-1161.

Kupper, Weibhar, Rißmann, Bessler; End-of-Life Prediction of a Lithium-Ion Battery Cell Based on Mechanistic Aging Models of the Graphite Electrode; ESC, Journal of The Electrochemical Society, 165 (14) A3468-A3480 (2018).

Laresgoiti, Kabitz, Ecker, Sauer; Modeling mechanical degradation in lithium ion batteries during cycling: Solid electrolyte interphase fracture; Elsevier, Journal of Power Sources 300 (2015) 112-122.

* cited by examiner

METHOD AND APPARATUS FOR MONITORING A BATTERY STATE ESTIMATOR

INTRODUCTION

A battery is an electrochemical device that stores and delivers electrical energy to power devices. Batteries are employed on numerous devices, including hybrid or electric vehicles, cell phones, etc. A battery may experience a decrease in charge capacity as a result of time and usage. For design purposes, a charge capacity decrease of 20% is nominally considered end-of-life, but some batteries may degrade faster or be used beyond that point.

One form of monitoring the charge capacity of a battery is to execute a Battery State Estimation (BSE) routine, which tracks battery parameters such as resistance. BSE parameters may be robust to charge capacity errors of 10-15%. At charge capacity errors greater than 15%, BSE parameters may become inaccurate, with unintended consequences. For example, when a battery is employed on a vehicle, a walk-home incident may occur if a battery unexpectedly achieves a maximum discharge limit.

One method to estimate a charge capacity includes using voltage measurements that are taken during a resting period, i.e., when the device is neither charging nor discharging the battery. Such voltage measurements must be available over a wide range of states of charge to achieve accurate results, and may be precluded for some devices due to usage patterns.

When a battery is employed on a vehicle, a vehicle owner or fleet manager needs some form of feedback with regard to a state of health of an on-vehicle battery, including a need for an automated alert when vehicle performance is affected due to degradation of the state of health of the on-vehicle battery.

SUMMARY

The concepts described herein operate to monitor a rechargeable electrochemical battery in-use, including detecting when a charge capacity estimate has achieved a level of uncertainty that may interfere with and negatively affect performance of the system in which the battery is employed. When the level of uncertainty of the charge capacity estimate is greater than a desired level of uncertainty, some form of remedial action or maintenance is indicated. Alternatively, when the level of uncertainty remains accurate, no maintenance will be indicated.

The concepts described herein include a method and associated system for monitoring a charge capacity of a battery that includes determining, via sensors, a current, voltage, and temperature of the battery. A predicted charge capacity and an associated first uncertainty parameter of the battery are determined based upon the current, voltage, and temperature of the battery, wherein the predicted charge capacity is determined by executing a charge capacity degradation model. A measured charge capacity and an associated second uncertainty parameter of the battery are determined based upon the current, voltage, and temperature of the battery, wherein the measured charge capacity is determined by executing a charge capacity update routine. A charge capacity estimate for the battery is determined based upon the predicted charge capacity and the measured charge capacity, and an updated uncertainty parameter for the charge capacity estimate is determined based upon the first and the second uncertainty parameters. A capacity maintenance routine is determined when the updated uncertainty parameter for the charge capacity estimate is greater than a first threshold.

An aspect of the disclosure includes executing a charge capacity degradation routine based upon the current, voltage, and temperature of the battery to determine the predicted charge capacity and the associated first uncertainty parameter of the battery.

Another aspect of the disclosure includes executing a charge capacity update routine based upon the current, voltage, and temperature of the battery to determine the measured charge capacity and the associated second uncertainty parameter of the battery.

Another aspect of the disclosure includes determining the updated uncertainty parameter for the charge capacity estimate based upon the first and the second uncertainty parameters by determining an actual covariance parameter for the charge capacity estimate based upon the first and the second uncertainty parameters.

Another aspect of the disclosure includes determining the updated charge capacity estimate for the battery based upon the predicted charge capacity and the measured charge capacity by subjecting the predicted charge capacity and the measured charge capacity to Kalman filtering.

Another aspect of the disclosure includes executing the capacity maintenance routine when the uncertainty parameter for the charge capacity estimate is greater than the first threshold by derating the battery based upon the updated charge capacity estimate and the uncertainty parameter.

Another aspect of the disclosure includes executing a remedial battery management operation when the updated uncertainty parameter for the charge capacity estimate is greater than a second threshold.

Another aspect of the disclosure includes executing the remedial battery management operation by discharging the battery to achieve a state of charge that is less than a low charge threshold, resting the battery for a period of time, and charging the battery and determining an updated charge capacity.

Another aspect of the disclosure includes commanding maintenance of the battery by replacing the battery.

Another aspect of the disclosure includes executing a battery state estimator routine to determine a state of charge an estimate of the expected variance in voltage prediction error based upon the current, voltage and temperature of the battery and the charge capacity estimate, and determining a covariance ratio based upon the variance in the actual voltage prediction error as compared to the expected variance in voltage prediction error.

Another aspect of the disclosure includes executing the remedial battery management operation when the covariance ratio is greater than a third threshold.

The above features and advantages, and other features and advantages, of the present teachings are readily apparent from the following detailed description of some of the best modes and other embodiments for carrying out the present teachings, as defined in the appended claims, when taken in connection with the accompanying drawings.

BRIEF DESCRIPTION OF THE DRAWINGS

One or more embodiments will now be described, by way of example, with reference to the accompanying drawings, in which.

Figure 1:
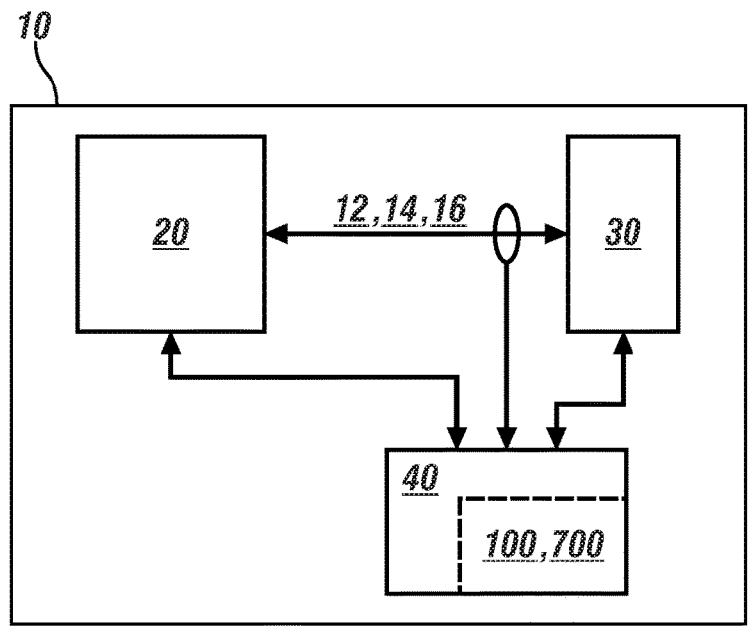
FIG. 1 schematically shows a device that includes a battery that is connected to an actuator for a device, and a controller, in accordance with the disclosure.

The appended drawings are not necessarily to scale, and may present a somewhat simplified representation of various preferred features of the present disclosure as disclosed herein, including, for example, specific dimensions, orientations, locations, and shapes. Details associated with such features will be determined in part by the particular intended application and use environment.

DETAILED DESCRIPTION

The components of the disclosed embodiments, as described and illustrated herein, may be arranged and designed in a variety of different configurations. Thus, the following detailed description is not intended to limit the scope of the disclosure, as claimed, but is merely representative of possible embodiments thereof. In addition, while numerous specific details are set forth in the following description in order to provide a thorough understanding of the embodiments disclosed herein, some embodiments can be practiced without some of these details. Moreover, for the purpose of clarity, certain technical material that is understood in the related art has not been described in detail in order to avoid unnecessarily obscuring the disclosure. Furthermore, the disclosure, as illustrated and described herein, may be practiced in the absence of an element that is not specifically disclosed herein. Furthermore, there is no intention to be bound by an expressed or implied theory presented in the preceding technical field, background, brief summary or the following detailed description. It should be understood that throughout the drawings, corresponding reference numerals indicate like or corresponding parts and features.

As used herein, the term "system" may refer to a combination or collection of mechanical and electrical hardware, software, firmware, electronic control component, processing logic, and/or processor device, individually or in combination, including without limitation: application specific integrated circuit (ASIC), an electronic circuit, a processor (shared, dedicated, or group) that executes one or more software or firmware programs, memory to contain software or firmware instructions, a combinational logic circuit, and/or other suitable components that provide the described functionality.

Embodiments may be described herein in terms of functional and/or logical block components and various processing steps. It should be appreciated that such block components may be realized by a number, combination or collection of mechanical and electrical hardware, software, and/or firmware components configured to perform the specified functions. For example, an embodiment may employ various combinations of mechanical components and electrical components, integrated circuit components, memory elements, digital signal processing elements, logic elements, look-up tables, or the like, which may carry out a variety of functions under the control of one or more microprocessors or other control devices. In addition, those skilled in the art will appreciate that the illustrated embodiments may be practiced in conjunction with a number of mechanical and/or electronic systems, and that the vehicle systems described herein are merely exemplary embodiment of possible implementations.

Referring to the drawings, wherein like reference numerals correspond to like or similar components throughout the several Figures, FIG. 1, consistent with embodiments disclosed herein, illustrates a device 10 that includes a rechargeable battery 20 that may provide electrical power to an actuator 30, wherein operation is controlled by a controller 40. The battery 20 may be a lithium-polymer device or another rechargeable electrochemical configuration that is arranged to supply electric power. The device 10 may be a vehicle, a cellular telephone, etc. When the device 10 is in the form of a vehicle, the vehicle may include, but not be limited to a mobile platform in the form of a commercial vehicle, industrial vehicle, agricultural vehicle, passenger vehicle, aircraft, watercraft, train, all-terrain vehicle, personal movement apparatus, robot and the like to accomplish the purposes of this disclosure. The actuator 30 may be an electric machine, a telecommunications device, an LED screen, etc.

Sensors are arranged to monitor parameters associated with the battery 20, including, e.g., a current sensor 12, a voltmeter 14 and a temperature sensor 16. Other sensors may be arranged in combination with the foregoing sensors. The controller 40 is arranged to monitor inputs from the sensors 12, 14, 16, and operating parameters of the device 10. The controller 40 includes an executable control routine in the form of a charge capacity assessment routine 100 for monitoring a charge capacity of the battery 20, which is described with reference to FIGS. 2 and 3. The charge capacity assessment routine 100 includes a charge capacity degradation routine 200, a charge capacity update routine 300, a filtering routine 400, a battery state estimator routine 500, a covariance monitor routine 600, and a capacity maintenance routine 700.

As the battery 20 of the device 10 ages, its charge capacity decreases. An accurate estimate of the battery charge state and an associated fast-charge de-rating depends on knowing the present charge capacity. For some usage patterns, this may require a capacity maintenance procedure. The charge capacity assessment routine 100 can automatically update the charge capacity estimate when certain conditions are met. If these conditions are not met or are marginally valid, elements of the capacity maintenance routine 700 may be commanded as described with reference to FIG. 3. However, execution of the capacity maintenance routine 700 can be deferred indefinitely if it is found to be unnecessary.

Capacity degradation may be classified into two categories, including a Loss of Lithium Inventory (LLI) and Loss of Active Material (LAM). Loss of Lithium Inventory occurs when lithium becomes bound up in side reactions or otherwise isolated from the desired electrochemical reaction. Possible mechanisms include growth of the SEI layer, wherein compounds containing lithium that build on electrode surfaces, and irreversible lithium plating. Loss of Active Material occurs when active material in the anode or cathode goes out of service. Mechanisms associated with LAM include active particles breaking up and some pieces losing electrical connectivity, delaminating particles, losing connection to the current collector, etc.

Referring again to FIG. 2, the charge capacity assessment routine 100 includes the charge capacity degradation routine 200. The monitored parameters associated with the battery 20, including inputs from the current sensor 12, voltmeter 14 and temperature sensor 16, are provided as inputs to the charge capacity degradation routine 200 to determine a predicted charge capacity 121 and an associated first uncertainty parameter 122 of the battery 20.

The capacity degradation routine 200 is executed to determine degradation in the charge capacity 121, which includes degradation associated with calendar aging and degradation associated with cyclic operation, i.e., charging and discharging events. Calendar aging occurs as SEI (solid electrolyte interphase) grows on the original graphite surface area. Cyclic aging occurs as charge cycling produces new surface area portions due to crack growth on which SEI then grows. The SEI is a layer of reaction products that forms where electrolyte meets electrode surfaces. Alternatively, an empirical model may treat charge cycling as an accelerating factor on a power-law model of SEI growth. Alternatively, other empirical models and detailed physico-chemical models for degradation may be employed.

The first uncertainty parameter 122 associated with the predicted charge capacity 121 arises because many of the parameters are estimated from short-term life tests. Extrapolation in the long-term may be uncertain, due at least in part to uncertainty in the degradation mechanisms. Uncertainty associated with extrapolation from short-term aging results, e.g., 12-18 months of lab testing, grows with time. Furthermore, lab test conditions may not fully capture conditions that a battery may experience in-use. Furthermore, there may be cell-to-cell variability, wherein individual battery cells may see different conditions that affect aging and wherein individual battery cells may not be tracked.

One embodiment of the capacity degradation routine 200 includes as follows. When D is defined as a fractional degradation of the charge capacity, the charge capacity may be determined as follows:

$$C(t) = (1 - D(t))C(0) \quad [1]$$

wherein:
C(t) is the charge capacity at time t,
D(t) is the fractional degradation of the charge capacity at time t,
C(0) is the charge capacity at time 0, i.e., before the battery 20 enters service.

An example degradation model combines calendar and cyclic effects on the charge capacity, and may be expressed as follows:

$$\frac{d}{dt}D_{cal} = k_{cal}(soc; p_{cal})Arr(T; E_{cal})D^{-1} + \epsilon_{cal} \quad [2]$$

$$\frac{d}{dt}D_{cyc} = k_{cyc}\left(\frac{I}{1-D}; p_{cyc}\right)Arr(T; E_{cyc})D^{-0.8} + \epsilon_{cyc}$$

$$\frac{d}{dt}D = \frac{d}{dt}D_{cal} + \frac{d}{dt}D_{cyc}$$

wherein
$D_{cal}$ represents calendar degradation,
$D_{cyc}$ represents cyclic degradation,
$E_{cal}$ represents calendar-based activation energy,
$E_{cyc}$ represents cyclic-based activation energy,
$p_{cal}$ represents a calendar-based tuning parameter,
$p_{cyc}$ represents a cyclic-based tuning parameter,
$k_{cal}(soc; p_{cal})$ represents a calendar-based pre-exponential factor,
$k_{cyc}(soc; p_{cal})$ represents a cyclic-based pre-exponential factor,
$\epsilon_{cal}$ represents uncertainty in the calendar degradation,
$\epsilon_{cyc}$ represents uncertainty in the cyclic degradation, and $Arr(T; E) = e^{(-E/RT)}$ represents an Arrhenius equation based upon temperature T and energy E, where R is the universal gas constant and T is in ° K.

The calendar-based tuning parameter pcar and the cyclic-based tuning parameter $p_{cyc}$ are employed to match lab data. In one embodiment, they may have some measurement basis, e.g. temperature, time, dimensional changes in the battery, etc., or they may be non-dimensional quantities that simply cause the model equations to match experimental data, and are based upon differences between model prediction and experimental data. The calendar-based pre-exponential factor and the cyclic-based pre-exponential factor are scalar values that are based upon empirical data in relation to the SOC and the respective calendar-based tuning parameter and cyclic-based tuning parameter. The $k_{cal}()$ and $k_{cyc}()$ terms may be predetermined and arranged in look-up tables and $Arr(T; E) = e^{(-E/RT)}$ have parameters $p_{cal}$, $p_{cyc}$, $E_{cal}$, $E_{cyc}$ that are tuned to match experimental data. The exponents on D may also be tuned.

The calendar aging is based upon the phenomenon that battery cell capacity will degrade with time even when no current is being passed, with the degradation being attributed to LLI that occurs due to SEI growth. The degradation rate depends on temperature (T), battery state of charge (SOC), and battery age. One diffusion model may be in the following form:

$$D_{cal} = \sqrt{t/\tau(SOC,T)} \quad [3]$$

wherein:
$D_{cal}$ represents the degradation rate due to calendar aging,
t represents elapsed time, and
$\tau$ represents a decay constant.

In differential form, Eq. 3 can be represented as follows:

$$\frac{d}{dt}D_{cal} = \frac{1}{2\tau\sqrt{t/\tau}} = \frac{1}{2\tau D_{cal}} \quad [4]$$

The cyclic degradation parameters may be in the form of empirical fits to data or be based on physical modeling. An example empirical model for determining the cyclic degradation $D_{cyc}$ is as follows:

$$D_{cyc} = \alpha(I, T)(Ah)^m, \text{ where } \alpha(I, T) = B(|I|)\exp\left(\frac{-E_0 + b \cdot |I|}{RT}\right) \quad [5]$$

wherein:
I=current, Ah=∫|I|dt, T=temperature, ° K,
m≈½, and
B (|I|) is tabulated, and is experimentally determined.
The differential form is as follows:

$$\frac{d}{dt}D_{cyc} = \alpha m(Ah)^{m-1}|I| = m|I|\alpha^{1/m}D_{cyc}^{(1-1/m)} \quad [6]$$

$$= m|I|B(|I|)^{1/m}\exp\left(\frac{-E_0 + b \cdot |I|}{mRT}\right)D_{cyc}^{(1-1/m)} \quad [7]$$

This may be expressed as follows, to include uncertainty:

$$\frac{d}{dt}D_{cyc} = m|I|\alpha^{1/m}D_{cyc}^{(1-1/m)} + \epsilon_{cyc} \quad [8]$$

Other models for determining the cyclic degradation include, by way of non-limiting examples, a model of LLI caused by electrode particle crack growth, wherein surfaces of particles crack during discharge as surface goes into tension. The surface stress is proportional to discharge rate. Cold particles may be brittle and crack more readily than warm particles. As each increment of surface area exposed by cracking grows new SEI, it begins to consume lithium at the same rate as calendar aging. Old cracks get partially passivated, new cracks react more quickly by the same $\sqrt{t/\tau}$ process.

Cyclic degradation may include SEI layer cracking, which is a form of LLI wherein particle expansion during charging cracks the protective SEI layer and new SEI forms, thereby consuming lithium. SEI stress is determined in relation to SOC. Cyclic degradation may include SEI growth rate, which is proportional to charge rate and SEI stress. Cyclic degradation may include electrode dry-out (LAM=Loss of Active Material), wherein gas that is formed during cycling isolates particles from the electrolyte.

The monitored parameters associated with the battery 20, including inputs from the current sensor 12, voltmeter 14 and temperature sensor 16 are provided to the charge capacity update routine 300, which determines a measured charge capacity 131 and an associated second uncertainty parameter 132 of the battery 20 based thereon. The charge capacity update routine 300 includes, in one embodiment, keeping a record of a Coulomb count, in amp-hours, between rested states to estimate the charge capacity of the battery 20.

In one embodiment, parameters are predetermined, including first and second rested voltages $v_1$, $v_2$, and the coulomb count Ah that is measured during a charging event or a discharging event for the battery 20 between the first rested voltage $v_1$ and the second rested voltage $v_2$. The first rested voltage, $v_1$ may be determined when the battery 20 is at or near a fully charged state, and the second rested voltage $v_2$ may be determined when the battery 20 is at or near a fully discharged state. The open-circuit voltage (OCV) curve may be represented as follows:

$$v = OCV(soc) \quad [9]$$

The charge capacity update routine 300 executes a reverse look-up of the states of charge from an open-circuit voltage (OCV) curve, as follows:

$$soc_1 = OCV^{-1}(v_1), soc_2 = OCV^{-1}(v_2) \quad [10]$$

wherein
$soc_1$ represents the battery SOC at the first rested voltage $v_1$, and
$soc_2$ represents the battery SOC at the second rested voltage $v_2$.

The charge capacity C may be approximated as follows:

$$C \approx \frac{\Delta Ah}{soc_2 - soc_1} \quad [11]$$

wherein ΔAh represents the signed coulomb count between the times of the two rested voltages, taken as positive for charging and negative for discharging.

For more than two rested voltages, a best-fit line may be employed to determine the charge capacity. Alternatively, an open-circuit voltage (OCV) shift routine may be executed to determine the charge capacity, wherein the OCV shift routine is based upon four rested voltages and associated coulomb counts (Ah), employing OCV curves that are associated with the positive and negative electrodes of the battery 20. Alternatively, the charge capacity may be determined based upon a model that monitors an OCV shift with aging, wherein the OCV is predicted based upon a fixed pattern of aging.

As such, the second uncertainty parameter 132 associated with the measured charge capacity 131 may be determined based upon uncertainty that may be introduced when recorded rested states are not fully rested because they do not reach a true equilibrium state. Furthermore, measurements of current, voltage and temperature have associated noise and other causes of variability. Furthermore, Coulomb counts over long periods of time may contain accumulated integration error. Furthermore there may be hysteresis in the open circuit voltage (OCV). Furthermore, methods employing two rested voltages assume a linearity therebetween that may be an approximation.

The uncertainty may be dealt with based upon probabilities. This includes evaluating voltage decay during each rest period to estimate uncertainty. This includes determining a difference between voltage at time of recording and the estimate voltage when an exponential decay will end. Error in the Coulomb count can be estimated as a random walk. The hysteresis and modeling errors may be determined empirically. As such, the charge capacity update routine 300 can provide the measured charge capacity 131 and the associated second uncertainty parameter 132.

The filtering routine 400 executes to determine a charge capacity estimate 141 for the battery 20 based upon the predicted charge capacity 121 and the measured charge capacity 131. This includes subjecting the measured charge capacity 131 and the predicted charge capacity 121 to Kalman filtering to determine the charge capacity estimate 141, which is provided as input to the battery state estimator routine 500. The first and second uncertainty parameters 122, 132 are also evaluated to determine an updated uncertainty parameter 142.

The charge capacity estimate 141 and the updated uncertainty parameter 142 are evaluated to detect a need for derating the battery at step 450. This includes employing a reduced current level to charge the battery 20 when the charge capacity estimate 141 is less than a desired threshold, or when the first and second uncertainty parameters 122, 132 are less than a desired threshold. These thresholds can be a fixed value or vary according to some reference quantity, e.g. capacity, as the cell ages. In particular, the magnitude of current used for fast charging of the battery may be scaled down in response to the reduced capacity because charging at too high a rate may degrade battery life. In one embodiment, when the battery capacity is at 90% of its original capacity, the current used for fast charging is reduced to 90% of the value that applies when the battery is new. The result is that fast charging takes the same time at end of life as at beginning of life of the battery 20.

The filtering routine 400 accumulates parameters associated with the battery 20, including the measured charge capacity 131 and the predicted charge capacity 121. When there are sufficient data points associated with battery rested states to issue a new capacity measurement, $C_{meas}$, it can be combined with the running capacity degradation prediction, $C_{pred}$, taking into account associated uncertainties to determine the charge capacity estimate 141, as follows:

$$C_* = \frac{\sigma_{pred}^2 C_{meas} + \sigma_{meas}^2 C_{pred}}{\sigma_{pred}^2 + \sigma_{meas}^2}, \sigma_*^2 = \frac{\sigma_{pred}^2 \sigma_{meas}^2}{\sigma_{pred}^2 + \sigma_{meas}^2} \quad [12]$$

wherein:
C* represents the charge capacity estimate 141,
$C_{pred}$ represents the predicted charge capacity 121,
$C_{meas}$ represents the measured charge capacity 131,
$\sigma_{pred}$ represents the first uncertainty parameter 122, i.e., a standard deviation, and
$\sigma_{meas}$ represents the second uncertainty parameter 132, i.e., a standard deviation.

When the first uncertainty parameter 122 is substantially less than the second uncertainty parameter 132 (i.e., $\sigma_{meas} \ll \sigma_{pred}$), then the charge capacity estimate 141 may be approximated as the measured charge capacity 131 and the updated uncertainty parameter 142 may be approximated as the second, measured uncertainty parameter 132, i.e., $C_* \approx C_{meas}$ and $\sigma_* \approx \sigma_{meas}$. Thus, a precise measurement will be selected, but a less precise measurement can be balanced with prediction. Also, the history of the charge capacity estimate 141 term $C_*$ can be used to update the prediction model for the battery 20. The $k_{cal}$ and $k_{cyc}$ terms can be adjusted up or down in proportion to a difference between the charge capacity estimate 141 and the predicted charge capacity 121, i.e., ($C_3 - C_{pred}$), which is based upon the relative contributions of calendar and cyclic capacity degradations, $D_{cal}$ and $D_{cyc}$, to the total capacity degradation D.

The battery state estimator (BSE) routine 500 determines an SOC 151 of the battery 20 based upon the inputs from the sensors 12, 14, 16, i.e., current, voltage, and temperature, and the charge capacity estimate 141. The BSE routine 500 also determines an associated SOC uncertainty parameter 152. The BSE routine 500 executes a Kalman filter algorithm to estimate the SOC 151, using the charge capacity estimate 141 as an input. The BSE routine 500 may be implemented using, by way of non-limiting examples, Kalman filtering, Extended Kalman filtering, Sigma-Point Kalman filtering, etc.

The covariance monitor 600 includes determining an uncertainty parameter in the form of a covariance ratio 610 for the charge capacity estimate based upon the SOC uncertainty parameter 152, which is determined based upon the updated uncertainty parameter 142 over time. The uncertainty parameter is an estimate of an expected variance in a voltage prediction error that is associated with the battery state estimator. The difference between the predicted and measured voltage of the battery 20 is monitored and compared to an expected covariance by the Kalman filter algorithm of the battery state estimator routine 500. The covariance ratio 610, i.e., cov(error observed)/cov(error expected) indicates whether the battery state estimator routine 500 is performing as expected. In effect, the covariance ratio 610 is determined as ratio of time-averaged voltage errors divided by the covariance expected in the Kalman filter algorithm of the battery state estimator routine 500. This includes as follows.

The Kalman filter algorithm of the battery state estimator routine 500 compares a predicted voltage to a measured voltage and uses this result to make a correction to the estimate of the SOC of the battery. The predicted voltage $\tilde{v}(t)$ at time $t_k$ is based on a math model of the battery 20, functions $f$, $h$ below, the measured current of the battery 20, 1, and an estimate, $\hat{x}$, of the battery's unknown state, x. This may be expressed as follows:

$$\tilde{x}(t_k) = f(\hat{x}(t_{k-1}), I(t_{k-1}))$$ [13]

$$\tilde{v}(t_k) = h(\tilde{x}(t_k), I(t_k))$$ [14]

At time $t_k$, a measurement of the voltage $\hat{v}(t_k)$ can be made. A voltage prediction error term ($z_k$) can be defined as a difference between the measured voltage $\hat{v}(t_k)$ and the predicted voltage $\tilde{v}(t)$, as follows:

$$z_k = \hat{v}(t_k) - \tilde{v}(t_k)$$ [15]

When the voltage values as indicated by the model, the estimate, and the measurement of the voltage are equivalent, the voltage prediction error term $z_k = 0$. Errors or variations in the aforementioned voltage values may be due to modeling limitations and measurement noise.

The Kalman filter algorithm of the battery state estimator routine 500 corrects the charge state estimate after the measurement. This is described with reference to Eq. 16, as follows, wherein the term $K_k$ is a Kalman gain matrix that is determined based on a model of the statistical noises associated with the prediction and the measurement.

$$\hat{x}(t_k) = \tilde{x}(t_k) + K_k z_k$$ [16]

The Kalman filter methodology produces a positive-definite symmetric matrix $P_k$ which is the covariance of the estimate according to the model:

$$P_k = \varepsilon((x_k - \hat{x}_k)(x_k - \hat{x}_k)^T)$$ [17]

wherein $\varepsilon$ represents an expectation, which is statistical term to denote the mathematical summation or integration of possible values from a random variable.

The model expressed in Eq. 17 translates into an estimated covariance C; for the voltage prediction error term $z_k$ as follows:

$$C_z^* = \mathcal{E}(z_k z_k^T) = H_k P_k H_k^T, \quad H_k = \frac{\partial h}{\partial \tilde{x}}$$ [18]

The voltage prediction error term $z_k$ may have a recorded history, and its actual covariance $C_z^a$ can be estimated as follows:

$$N_k = \gamma N_{k-1} + z_k z_k^T, \quad M_k = \gamma M_{k-1} + 1, \text{ and}$$ [19]

$$C_z^a = \frac{N_k}{M_k}$$

wherein:
0<γ<1 is a forgetting factor.

Accordingly, the covariance ratio $r_{cov}$ can be determined as follows:

$$r_{cov} = \|C_z^a\|/\|C_z^*\|$$ [20]

wherein:
$C_z^a$ represents the actual covariance, i.e., the updated uncertainty parameter 142,
$C_z^*$ represents the estimated covariance, and
$\|\cdot\|$ is a suitable matrix norm.

In the battery model, z is a scalar, so the covariance ratio r co, is determined as follows:

$$r_{cov} = C_z^a / C_z^*$$ [21]

Ideally, the covariance ratio $r_{cov} = 1$. When the covariance ratio $r_{cov} \gg 1$, the actual error history is inconsistent with the model, indicating that the model is no longer valid. This is an indication that the battery has entered an unexpected condition, with one possibility being that its actual capacity differs from the estimated charge capacity from the charge capacity assessment routine 100. In such case, a capacity check or another battery service may be recommended.

Figure 3:
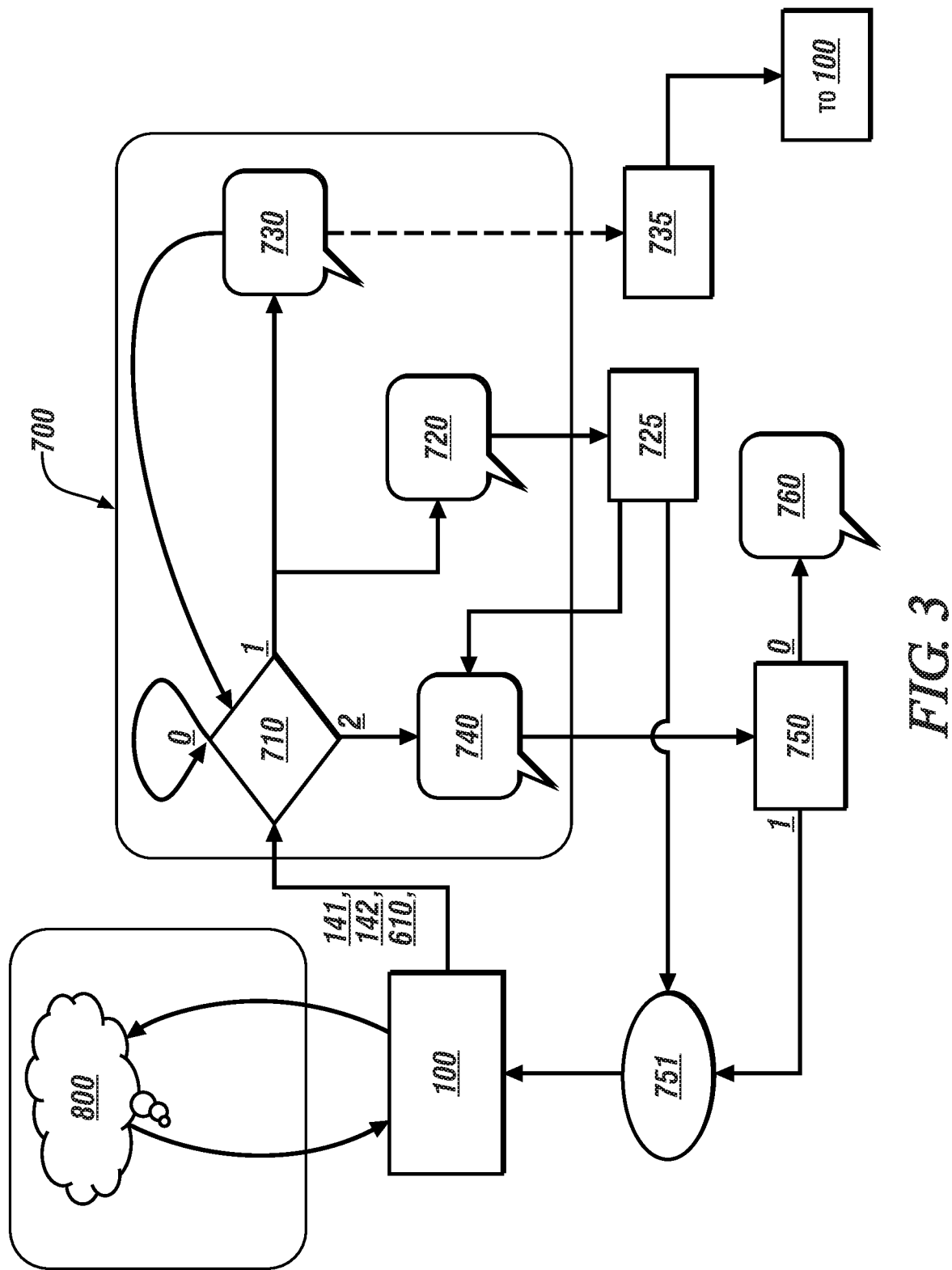
FIG. 3 schematically shows a second flowchart associated with the executable control routine for monitoring the charge capacity of the battery described with reference to FIG. 1, in accordance with the disclosure.

Referring now to FIG. 3, the capacity maintenance routine 700 is described. Elements of the capacity maintenance routine 700 may include executing an owner action 730, executing a smart charger operation 725, and/or executing a service check 750. This includes executing a remedial operation when the updated uncertainty parameter 142 and/or the covariance ratio 610 are greater than respective thresholds, which are calibratable. When the estimated charge capacity has a high level of uncertainty, related parameters such as travel range of a vehicle may be erroneous. Thus, owner action may be required to trigger an automatic capacity update, or in more severe cases, when battery service is required, while avoiding a requirement for scheduled battery service. Moreover, it may be recommended to remove a battery from service when it has reached an end-of-life condition by triggering a service alert when an end-of-life condition has been reached (760).

The capacity maintenance routine 700 monitors and evaluates the charge capacity estimate 141, the updated uncertainty parameter 142 and the covariance ratio 610 in comparison with predefined thresholds. When the aforementioned parameters are less than their respective thresholds (710)(0), this iteration ends without further action.

When either the covariance of the running capacity estimate, i.e., the updated uncertainty parameter 142, exceeds a third threshold (e.g., >10% of the charge capacity) or the covariance ratio 610 exceeds a corresponding fourth threshold, then a capacity maintenance warning is issued recommending remedial actions, as described with reference to Steps 720 and 730. The recommendations for service, as described with reference to Steps 740, 750, and 760, may be issued when the charge capacity estimate falls below an end-of-life value for the charge capacity.

An action threshold may be set as follows. The charge capacity can be expressed as follows:

$$C(t)=C(0)\cdot(1-D(t)) \quad [22]$$

wherein:
C(0) is a charge capacity estimate at time t=0, i.e., at a start of life,
C(t) is a charge capacity estimate at time t, and
D(t)=fractional degradation.

A charge capacity degradation alert can be set as follows based upon the charge capacity uncertainty, wherein the charge capacity uncertainty is indicated by $\sigma_C$.

$$(C(t)+n\sigma_C)/C(0)<tol_0 \quad [23]$$

wherein:
$tol_0$ represents a desired tolerance at t=0,
$\sigma_C$ represents a 1-sigma uncertainty in C, i.e., the charge capacity uncertainty, and
n represents statistical confidence.

When $(C(t)+n\sigma_C)/C(0)<tol_0$, (710)(2), there is a high confidence that the battery 20 has reached its end of life. In this case, a service action is recommended (740), wherein the charge capacity of the battery 20 is evaluated at a service facility (750). When the charge capacity of the battery 20 is less than a threshold capacity (750)(0), replacement of the battery 20 is recommended (760).

By way of a non-limiting example, when n=2 and $tol_0$=0.80, there is a 98% confidence that the charge capacity has fallen below 80% of its start-of-life value. If an evaluation at a service facility indicates that the battery is beyond its end of life, it needs to be taken out of service. This may be limited to replacement of just one module in a multi-module battery pack when the battery 20 has the capability to individually monitor and replace modules.

When the charge capacity uncertainty $\sigma_C$ is such that $$\frac{\sigma_C}{C} > tol_1,$$

i.e., it indicates that updates to the charge capacity have been insufficiently accurate (710)(1), and action to reduce the charge capacity uncertainty needs to be undertaken. This can be in the form of advising an operator of a need for remedial action (730), which they can undertake (735). This can also be in the form of triggering operation of a smart charging system (720).

When the charge capacity uncertainty $\sigma_C$ is such that $$\frac{\sigma_C}{C} > tol_2 > tol_1,$$

uncertainty in capacity estimate may intolerably large (710)(2), such that the charge capacity estimate 141 may be becoming unstable due to the charge capacity uncertainty. Again, a service action is recommended (740), wherein the charge capacity of the battery 20 is evaluated at a service facility (750).

The uncertainty alert logic for $\sigma_C$ includes employing the covariance ratio, $r_{cov}$ to determine the charge capacity uncertainty. This includes periodically monitoring and statistically evaluating the covariance ratio $r_{cov}$, and related factors such as a peak value, an RMS value, a percent of time wherein $r_{cov}>2$, etc., while eliminating difficult areas, such as when soc<5% or T<−10° C.

Figure 2:
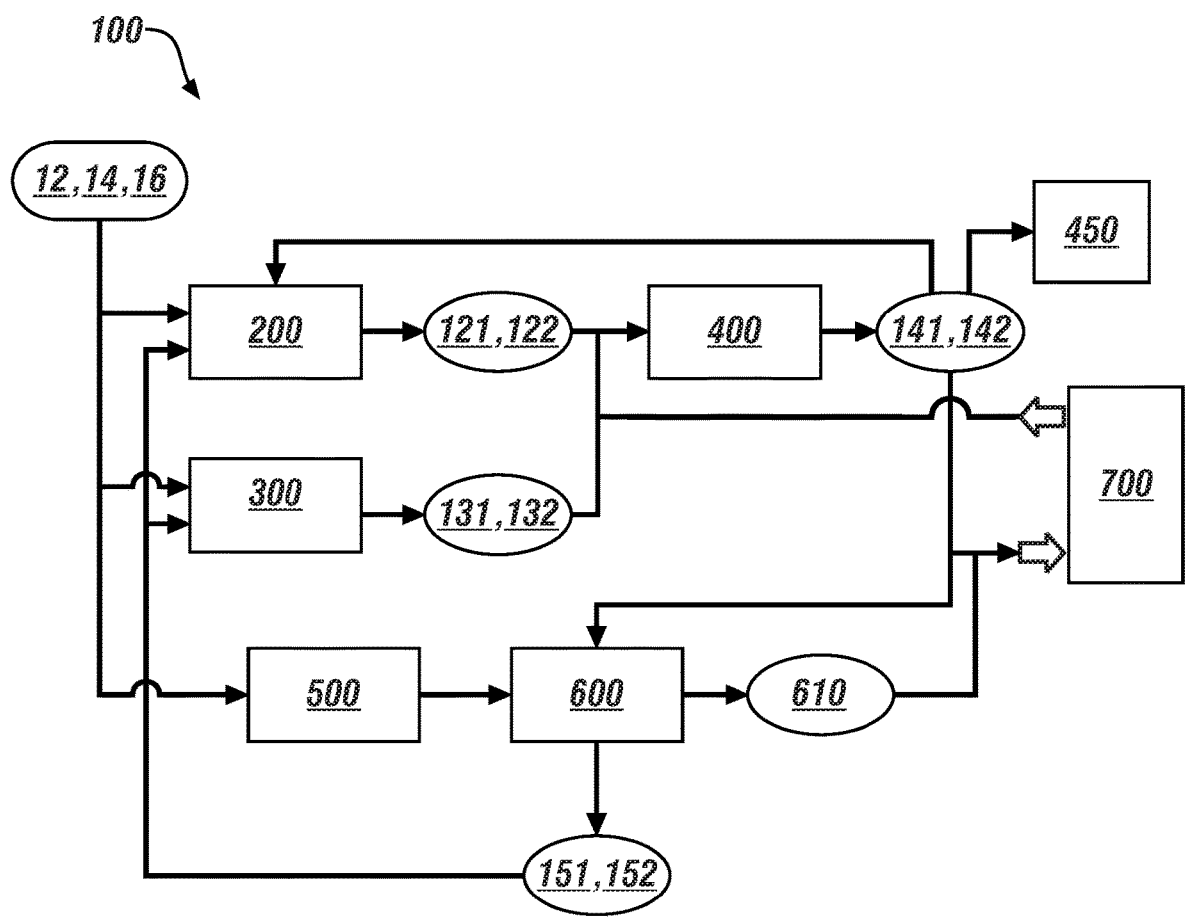
FIG. 2 schematically shows a first flowchart associated with an executable control routine for monitoring a charge capacity of the battery described with reference to FIG. 1, in accordance with the disclosure.

Referring again to FIG. 3, with continued reference to the device described with reference to FIG. 1 and the charge capacity assessment routine 100 described with reference to FIG. 2, the remedial action can be undertaken (720), (730) due to the charge capacity uncertainty of the battery 20, including when $$\frac{\sigma_C}{C} > tol_1,$$

which indicates that previous updates to the charge capacity have been insufficiently accurate, and action may be recommended and undertaken to reduce the charge capacity uncertainty.

Remedial action to reduce the charge capacity uncertainty includes, in one embodiment, connecting the device 10 to a smart charger to update the charge capacity of the battery 20 (720). This includes determining a present SOC for the battery 20 to determine whether the initial SOC of the battery 20 is less than a low charge threshold. When the initial SOC is greater than the low charge threshold, the smart charger may initially discharge the battery 20 by dissipating stored energy from the battery 20. This can include operating an electrically-powered device or storing electrical energy on another device. When the SOC of the battery 20 is less than the low charge threshold, the battery 20 is controlled to rest for a minimum period of time. The term "rest" as applied to a battery, includes a stasis condition in which the battery is neither charging nor discharging. At the end of the rest period, the battery 20 subjected to charging, and is charged to a full charge state, at which point the charge capacity update routine 300 can execute to determine an updated charge capacity 751 (725). The updated charge capacity 751 is communicated to the charge capacity assessment routine 100.

The remedial action can further include recommending driver action (730), which includes directing the driver to operate the device, e.g., vehicle until it achieves a low SOC state, and allowing the device 10 to rest before executing a recharging event. This enables the charge capacity update routine 300 to update the measured charge capacity 131 and an associated second uncertainty parameter 132 of the battery 20 (735).

When the uncertainty in the charge capacity estimate is greater than desired, and the charge state estimator may be unable to track the charge capacity accurately, and the updated charge capacity 751 is communicated to the capacity maintenance routine 700 (740). In this case, an owner may be advised to take the device 10 to a service center to conduct a charge capacity check. The outcome either determines that the battery is healthy and the accurate charge capacity is sent to the charge capacity assessment routine 100 (750)(1), or it determines that the charge capacity is too low (750)(0), with service such as replacing a battery module being recommended (760).

The results of the charge capacity assessment routine 100 may be communicated to remote service center (800). Degradation behavior across multiple devices 10 in the field can inform a prediction model. Each day's prediction update and each capacity update can be collected, including service garage capacity updates, and the data can be analyzed to tune the degradation prediction model, with a periodic communication to individual ones of the device 10 to update parameters in the on-board degradation model, i.e., to update parameters associated with the charge capacity assessment routine 100 described with reference to FIG. 2.

The term "controller" and related terms such as microcontroller, control module, module, control, control unit, processor and similar terms refer to one or various combinations of Application Specific Integrated Circuit(s) (ASIC), Field-Programmable Gate Array (FPGA), electronic circuit(s), central processing unit(s), e.g., microprocessor(s) and associated non-transitory memory component(s) in the form of memory and storage devices (read only, programmable read only, random access, hard drive, etc.). The non-transitory memory component is capable of storing machine readable instructions in the form of one or more software or firmware programs or routines, combinational logic circuit(s), input/output circuit(s) and devices, signal conditioning and buffer circuitry and other components that can be accessed by one or more processors to provide a described functionality. Input/output circuit(s) and devices include analog/digital converters and related devices that monitor inputs from sensors, with such inputs monitored at a preset sampling frequency or in response to a triggering event. Software, firmware, programs, instructions, control routines, code, algorithms and similar terms mean controller-executable instruction sets including calibrations and look-up tables. Each controller executes control routine(s) to provide desired functions. Routines may be executed at regular intervals, for example each 100 microseconds during ongoing operation. Alternatively, routines may be executed in response to occurrence of a triggering event. Communication between controllers, actuators and/or sensors may be accomplished using a direct wired point-to-point link, a networked communication bus link, a wireless link or another suitable communication link. Communication includes exchanging data signals in suitable form, including, for example, electrical signals via a conductive medium, electromagnetic signals via air, optical signals via optical waveguides, and the like. The data signals may include discrete, analog or digitized analog signals representing inputs from sensors, actuator commands, and communication between controllers.

The term "signal" refers to a physically discernible indicator that conveys information, and may be a suitable waveform (e.g., electrical, optical, magnetic, mechanical or electromagnetic), such as DC, AC, sinusoidal-wave, triangular-wave, square-wave, vibration, and the like, that is capable of traveling through a medium.

The term 'model' refers to a processor-based or processor-executable code and associated calibration that simulates a physical existence of a device or a physical process. As used herein, the terms 'dynamic' and 'dynamically' describe steps or processes that are executed in real-time and are characterized by monitoring or otherwise determining states of parameters and regularly or periodically updating the states of the parameters during execution of a routine or between iterations of execution of the routine.

The terms "calibration", "calibrated", and related terms refer to a result or a process that compares an actual or standard measurement associated with a device or system with a perceived or observed measurement or a commanded position for the device or system. A calibration as described herein can be reduced to a storable parametric table, a plurality of executable equations or another suitable form that may be employed as part of a measurement or control routine.

A parameter is defined as a measurable quantity that represents a physical property of a device or other element that is discernible using one or more sensors and/or a physical model. A parameter can have a discrete value, e.g., either "1" or "0", or can be infinitely variable in value.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims.

What is claimed is:

1. A method for monitoring a charge capacity of a battery, the method comprising:
    monitoring, via sensors, a current, a voltage, and a temperature of the battery;
    determining a predicted charge capacity and an associated first uncertainty parameter of the battery based upon the current, voltage, and temperature of the battery;
    determining a measured charge capacity and an associated second uncertainty parameter of the battery based upon the current, voltage, and temperature of the battery;
    determining a charge capacity estimate for the battery based upon the predicted charge capacity and the measured charge capacity;
    determining an updated uncertainty parameter for the charge capacity estimate based upon the first and the second uncertainty parameters; and
    executing, via a controller, a capacity maintenance routine when the updated uncertainty parameter for the charge capacity estimate is greater than a first threshold, including derating the battery based upon the charge capacity estimate and the uncertainty parameter.

2. The method of claim 1, comprising executing a charge capacity degradation routine based upon the current, voltage, and temperature of the battery to determine the predicted charge capacity and the associated first uncertainty parameter of the battery.

3. The method of claim 1, comprising executing a charge capacity update routine based upon the current, voltage, and temperature of the battery to determine the measured charge capacity and the associated second uncertainty parameter of the battery.

4. The method of claim 1, wherein determining the updated uncertainty parameter for the charge capacity estimate based upon the first and the second uncertainty parameters comprises determining an actual covariance parameter for the charge capacity estimate based upon the first and the second uncertainty parameters.

5. The method of claim 1, wherein determining the charge capacity estimate for the battery based upon the predicted charge capacity and the measured charge capacity comprises subjecting the predicted charge capacity and the measured charge capacity to Kalman filtering.

6. The method of claim 1, further comprising executing a +remedial battery management operation when the updated uncertainty parameter for the charge capacity estimate is greater than a second threshold.

7. The method of claim 6, wherein executing the remedial battery management operation comprises:
discharging the battery to achieve a state of charge that is less than a low charge threshold;
resting the battery for a period of time; and
charging the battery and determining an updated charge capacity.

8. The method of claim 6, wherein commanding maintenance of the battery further comprises replacing the battery.

9. The method of claim 1, further comprising:
executing a battery state estimator routine to determine a state of charge and an estimate of an expected variance in a voltage prediction error based upon the current, voltage and temperature of the battery and the charge capacity estimate; and
determining a covariance ratio based upon a variance in an actual voltage prediction error and the expected variance in the voltage prediction error.

10. The method of claim 9, further comprising executing a remedial battery management operation when the covariance ratio is greater than a third threshold.

11. A device, comprising:
a rechargeable battery arranged to supply electrical power to an actuator;
a plurality of sensors arranged to monitor a current, a voltage, and a temperature of the battery; and
a controller, operably connected to the actuator and in communication with the battery and the plurality of sensors, the controller including an instruction set, the instruction set executable to monitor a charge capacity of the battery, including:
monitor, via the sensors, the current, voltage, and temperature of the battery,
determine a predicted charge capacity and an associated first uncertainty parameter of the battery based upon the current, voltage, and temperature of the battery, determining a measured charge capacity and an associated second uncertainty parameter of the battery based upon the current, voltage, and temperature of the battery,
determine a charge capacity estimate for the battery based upon the predicted charge capacity and the measured charge capacity,
determine an updated uncertainty parameter for the charge capacity estimate based upon the first and the second uncertainty parameters,
execute a capacity maintenance routine when the updated uncertainty parameter for the charge capacity estimate is greater than a first threshold, and
command maintenance of the battery when the uncertainty parameter for the charge capacity estimate is greater than a second threshold, including:
discharge the battery to achieve a state of charge that is less than a low charge threshold,
rest the battery for a period of time, and
charge the battery and determine an updated charge capacity estimate.

12. The device of claim 11, wherein the instruction set is executable to execute a charge capacity degradation routine based upon the current, voltage, and temperature of the battery to determine the predicted charge capacity and the associated first uncertainty parameter of the battery.

13. The device of claim 11, wherein the instruction set is executable to execute a charge capacity update routine based upon the current, voltage, and temperature of the battery to determine the measured charge capacity and the associated second uncertainty parameter of the battery.

14. The device of claim 11, wherein the instruction set executable to determine the updated uncertainty parameter for the charge capacity estimate based upon the first and the second uncertainty parameters comprises the instruction set executable to determine an actual covariance parameter for the charge capacity estimate based upon the first and the second uncertainty parameters.

15. The device of claim 11, wherein the instruction set executable to determine the charge capacity estimate for the battery based upon the predicted charge capacity and the measured charge capacity comprises the instruction set executable to subject the predicted charge capacity and the measured charge capacity to Kalman filtering.

16. The device of claim 11, wherein the instruction set executable to execute the capacity maintenance routine when the updated uncertainty parameter for the charge capacity estimate is greater than the first threshold comprises the instruction set executable to derate the battery based upon the charge capacity estimate and the uncertainty parameter.

17. The device of claim 11, wherein the instruction set executable to command maintenance of the battery further comprises the instruction set executable to command replacement of the battery.

18. The device of claim 11, further comprising the instruction set being executable to:
execute a battery state estimator routine to determine a state of charge and an estimate of an expected variance in a voltage prediction error based upon the current, voltage and temperature of the battery and the charge capacity estimate; and
determine a covariance ratio based upon a variance in an actual voltage prediction error and the expected variance in the voltage prediction error.

19. The method of claim 18, further comprising executing a remedial battery management operation when the covariance ratio is greater than a third threshold.

* * * * *